US011103892B1

(12) United States Patent
Liao et al.

(10) Patent No.: US 11,103,892 B1
(45) Date of Patent: Aug. 31, 2021

(54) INITIATED CHEMICAL VAPOR DEPOSITION METHOD FOR FORMING NANOVOIDED POLYMERS

(71) Applicant: Facebook Technologies, LLC, Menlo Park, CA (US)

(72) Inventors: Christopher Yuan Ting Liao, Seattle, WA (US); Andrew John Ouderkirk, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 242 days.

(21) Appl. No.: 16/214,779

(22) Filed: Dec. 10, 2018

Related U.S. Application Data

(60) Provisional application No. 62/736,441, filed on Sep. 25, 2018.

(51) Int. Cl.
*C23C 16/56* (2006.01)
*B05D 1/00* (2006.01)
*G02F 1/00* (2006.01)

(52) U.S. Cl.
CPC ............ *B05D 1/60* (2013.01); *C23C 16/56* (2013.01); *G02F 1/0018* (2013.01); *G02F 1/0054* (2013.01)

(58) Field of Classification Search
CPC ......... C23C 16/56; B05D 1/60; G02F 1/0018; G02F 1/0054
See application file for complete search history.

(56) References Cited

U.S. PATENT DOCUMENTS

| 6,958,860 B2 * | 10/2005 | Dontula | G02B 5/0221 |
| | | | 359/518 |
| 2002/0182321 A1 * | 12/2002 | Mocella | B05D 1/60 |
| | | | 427/255.28 |
| 2007/0161796 A1 * | 7/2007 | Kor-Sade | C07D 215/18 |
| | | | 546/180 |
| 2010/0047716 A1 * | 2/2010 | Sakurai | H01L 21/312 |
| | | | 430/296 |

(Continued)

FOREIGN PATENT DOCUMENTS

| WO | WO 2010/120468 A1 * | 10/2010 | ................ C08J 9/28 |
| WO | WO 2011/088161 A1 * | 7/2011 | ............. B29C 67/20 |

(Continued)

OTHER PUBLICATIONS

Elder, Robert M., et al., "Nanovoid formation and mechanics: a comparison of poly(dicyclopentadiene) and epoxy networks from molecular dynamics simulations". Soft Matter, 2016, 12, pp. 4418-4434.*

(Continued)

*Primary Examiner* — Bret P Chen
(74) *Attorney, Agent, or Firm* — FisherBroyles, LLP (57) ABSTRACT

An initiated chemical vapor deposition (i-CVD) method for forming a nanovoided polymeric material may include heating a mixture including a gaseous monomer, a gaseous polymerization initiator, and a solvent to form a polymeric thin film including the solvent and removing the solvent from the polymeric thin film to form a nanovoided thin film. Devices, including dielectric elastomer actuators, may be formed using the nanovoided polymeric material. Various other methods, systems, apparatuses, and materials are also disclosed.

20 Claims, 5 Drawing Sheets

(56) References Cited

U.S. PATENT DOCUMENTS

| | | | | |
|---|---|---|---|---|
| 2010/0190888 | A1* | 7/2010 | Gaeberlein | C04B 28/02 |
| | | | | 524/5 |
| 2012/0098421 | A1* | 4/2012 | Thompson | H01L 51/5262 |
| | | | | 313/512 |
| 2012/0099323 | A1* | 4/2012 | Thompson | H01L 51/5275 |
| | | | | 362/257 |
| 2013/0011608 | A1* | 1/2013 | Wolk | G02B 5/0268 |
| | | | | 428/141 |
| 2014/0071653 | A1* | 3/2014 | Thompson | G02B 6/0055 |
| | | | | 362/19 |
| 2014/0113451 | A1* | 4/2014 | Sakurai | H01L 21/312 |
| | | | | 438/702 |
| 2015/0177441 | A1* | 6/2015 | Sherman | G02B 6/0065 |
| | | | | 362/606 |
| 2015/0330597 | A2* | 11/2015 | Schaffer | B82Y 30/00 |
| | | | | 362/603 |
| 2016/0001232 | A1* | 1/2016 | Bond | H01G 11/86 |
| | | | | 29/623.5 |
| 2017/0050214 | A1* | 2/2017 | Boscher | H01J 37/32348 |
| 2019/0185629 | A1* | 6/2019 | Pan | C08J 7/123 |
| 2019/0296218 | A1* | 9/2019 | Ouderkirk | H01L 41/09 |
| 2020/0183168 | A1* | 6/2020 | Spann | G02F 1/0102 |
| 2020/0193168 | A1* | 6/2020 | Zhao | H04L 9/3239 |
| 2020/0224745 | A1* | 7/2020 | Landig | F16F 15/005 |
| 2020/0227020 | A1* | 7/2020 | Landig | C03C 17/32 |

FOREIGN PATENT DOCUMENTS

| | | | | |
|---|---|---|---|---|
| WO | WO 2012/054318 A1 * | 4/2012 | | G02B 5/08 |
| WO | WO 2020/146593 A1 * | 7/2020 | | B06B 1/06 |

OTHER PUBLICATIONS

Elder, Robert M., et al., "Mechanics and nanovoid nucleation dynamics: effects of polar functionality in glassy polymer networks". Soft Matter, 2018, 14, pp. 8895-8911.*

Michler, Goerg H., et al., "The physics and micro-mechanics of nano-voids and nano-particles in polymer combinations". Polymer 54 (2013) pp. 3131-3144.*

Void Technologies brochure "Nano-voided films: Less material, more value", pp. 1-4. No date available.*

Rizzardo, Ezio, et al., "Tailored Polymers by Free Radical Processes". Macromolecular Symposia, 143(1), pp. 291-307 (1999). DOI: 10.1002/masy.19991430122.*

De Sterck, Bart, et al., "Solvent Effects on Free Radical Polymerization Reactions: The Influence of Water on the Propagation Rate of Acrylamide and Methacrylamide". Macromolecules 2010, 43, 827-836. DOI: 10.1021/ma9018747.*

Miriyev et al., "Soft material for soft actuators", Nature Communications, Department of Mechanical Engineering, vol. 3, No. 596, 2017, pp. 1-8.

Pilet et al., "Piezoelectricity enhancement of P(VDF/TrFE) by X-ray irradiation", Organic Electronics, vol. 37, 2016, pp. 257-262.

Liu et al., "Control of crystal morphology and its effect on electromechanical performances of electrostrictive P(VDF-TrFE-CTFE) terpolymer", European Polymer Journal, vol. 91, 2017, pp. 46-60.

Le et al., "All-organic electrostrictive polymer composites with low driving electrical voltages for micro-fluidic pump applications", Scientific Reports, 5:11814, 2015, pp. 1-13.

Xia et al., "PVDF-based dielectric polymers and their applications in electronic materials", IET Nanodielectrics, vol. 1, No. 1, 2018, pp. 17-31.

Wang et al., "Tactile-Sensing Based on Flexible PVDF Nanofibers via Electrospinning: A Review", Sensors, vol. 18, 330, 2018, pp. 1-16.

Stevens et al., "A Review of Adjustable lenses for Head Mounted Displays", International Society for Optics and Photonics, Proceedings of SPIE, vol. 10335, Digital Optical Technologies, Sep. 12, 2017, 20 pages.

Li et al., "Studies on the transformation process of PVDF from a top phase by stretching", RSC Advances, vol. 4, 2014, pp. 3938-3943.

Mohammadi et al., "Effect of tensile strain rate and elongation on crystalline structure and piezoelectric properties of PVDF thin films", Polymer Testing, vol. 26, 2007, pp. 42-50.

Lazarus et al., "Geometry-Induced Rigidity in Nonspherical Pressurized Elastic Shells", Physical Review Letters, vol. 109, No. 14, 2012, 6 pages.

Bonora et al., Active diffraction gratings: Development and tests, Review of Scientific Instruments, vol. 83, No. 12, Dec. 19, 2012, pp. 1-9.

"Manufacture of dichroics, areas of application and specifications", Technology, specifications and application of dichroic filters, URL: https://www.prinzoptics.de/en/technology-specifications-and-application-dichroic-filters, as accessed on 2018, pp. 1-24.

Kleinhans, W. A., "Aberrations of curved zone plates and Fresnel lenses", Applied Optics, vol. 16, No. 6, Jun. 1977, pp. 1701-1704.

Haertling, G. H., "Improved Hot-Pressed Electrooptic Ceramics in the (Pb,La)(Zr,Ti)O3 System", Journal of the American Ceramic Society, vol. 54, No. 6, Jun. 1971, pp. 1-19.

Jiang et al., "Transparent Electro-Optic Ceramics and Devices", Optoelectronic Devices and Integration, International Society for Optics and Photonics, Proceedings of SPIE, vol. 5644, 2004, 16 pages.

Kong et al., "Transparent Ceramic Materials", Transparent Ceramics, Topics in Mining, Metallurgy and Materials Engineering, 2015, pp. 29-91.

* cited by examiner

INITIATED CHEMICAL VAPOR DEPOSITION METHOD FOR FORMING NANOVOIDED POLYMERS

This application is a non-provisional utility application which claims the benefit of U.S. Provisional Application No. 62/736,441, filed Sep. 25, 2018, the disclosure of which is incorporated herein by reference in its entirety.

BACKGROUND

Polymeric materials may be incorporated into a variety of different optic and electro-optic device architectures, including active and passive optics and electroactive devices. Electroactive polymer (EAP) materials, for instance, may change their shape under the influence of an electric field. EAP materials have been investigated for use in various technologies, including actuation, sensing and/or energy harvesting. Lightweight and conformable, electroactive polymers may be incorporated into wearable devices such as haptic devices and are attractive candidates for emerging technologies including virtual reality/augmented reality devices where a comfortable, adjustable form factor is desired.

Virtual reality (VR) and augmented reality (AR) eyewear devices or headsets, for instance, may enable users to experience events, such as interactions with people in a computer-generated simulation of a three-dimensional world or viewing data superimposed on a real-world view. VR/AR eyewear devices and headsets may also be used for purposes other than recreation. For example, governments may use such devices for military training, medical professionals may use such devices to simulate surgery, and engineers may use such devices as design visualization aids.

These and other applications may leverage one or more characteristics of thin film polymeric materials, including the refractive index to manipulate light and/or the Poisson's ratio to generate a lateral deformation as a response to compression between conductive electrodes in electroactive applications. The deformation may be used to actuate deformable optical elements in an optical assembly, such as a lens system.

Notwithstanding recent developments, it would be advantageous to provide polymeric materials having improved characteristics, including a controllable deformation response and/or a tunable refractive index.

SUMMARY

As will be described in greater detail below, the instant disclosure relates to the formation of nanovoided polymeric materials and the fabrication of devices using such materials. An initiated chemical vapor deposition (i-CVD) process may be used to form a polymeric thin film on a substrate, where incorporation of a solvent into the nascent polymer inhibits complete densification of the polymeric matrix. The subsequent removal of the solvent may produce a nanovoided polymer structure.

According to certain embodiments, an initiated chemical vapor deposition method may include (i) introducing a mixture containing a gaseous polymerization initiator, a gaseous monomer, and a solvent into a reaction chamber, (ii) forming free-radicals of the polymerization initiator, and (iii) contacting a substrate within the reaction chamber with the free-radicals, the gaseous monomer, and the solvent to form a polymeric thin film on the substrate. The method may also include subsequently removing at least a portion of the solvent from the polymeric thin film to form a nanovoided polymeric thin film on the substrate.

In accordance with certain embodiments, the void size and the void size distribution within the polymeric thin film may be controlled by varying the chemistry of the mixture, including the ratio of gaseous monomer to solvent, which may be constant or varied during introduction of the mixture into the reaction chamber. For instance, a ratio of a flow rate of the gaseous monomer to a flow rate of the solvent during formation of the polymeric thin film can range from approximately 0.1 to approximately 10. In some embodiments, the refractive index of the nanovoided polymeric thin film may range from approximately 1.05 to approximately 1.35. In some embodiments, the gaseous monomer and the solvent are simultaneously introduced into the reaction chamber where a ratio of a flow rate of the gaseous monomer to a flow rate of the solvent increases during a primary stage of forming the polymeric thin film and decreases during a secondary stage of forming the polymeric thin film, where the secondary stage follows the primary stage. In at least one example, forming the free-radicals may include heating the mixture to form the free-radicals of the polymerization initiator.

Removal of the solvent (e.g., by evaporation) may be performed periodically during formation of the polymeric thin film and/or following formation of the polymeric thin film. As will be appreciated, nanovoids are formed within and defined by regions of the polymer matrix previously occupied by the solvent. In certain embodiments, the solvent may include one or more co-solvents, such as a first solvent and a second solvent where, in some examples, the first solvent is immiscible with the second solvent. In some embodiments, a 2-step cure may be used control the topology of the voids, where a first portion of the polymeric thin film is cured prior to removing the solvent and a second portion of the polymeric thin film is cured after removing the solvent.

A further method may include (i) heating a mixture of a gaseous polymerization initiator, a gaseous monomer, and a solvent to form a polymeric thin film that includes the solvent and (ii) removing the solvent from the polymeric thin film to form a nanovoided polymeric thin film. In certain embodiments, removal of the solvent may include forming an azeotrope containing the solvent.

A still further method includes heating a mixture comprising a gaseous polymerization initiator, a gaseous monomer, and a solvent to form a polymeric thin film on a substrate, where the polymeric thin comprises the solvent, and heating the substrate to remove the solvent from the polymeric thin film to form a nanovoided polymeric thin film.

The nanovoided polymeric thin film may be deposited onto a planar substrate or conformally onto a shaped substrate, such as a substrate having a high aspect ratio (e.g., a fibrous substrate), and may be used to form a variety of different devices, including actuators, passive and active optics, and optical waveguides.

Features from these and any of the other embodiments disclosed herein may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification.

Together with the following description, these drawings demonstrate and explain various principles of the instant disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within this disclosure.

DETAILED DESCRIPTION OF EXEMPLARY EMBODIMENTS

The present disclosure is generally directed to methods of forming nanovoided polymers, and more particularly to initiated chemical vapor deposition (i-CVD) methods for forming nanovoided polymeric thin films. An example i-CVD method may include introducing a precursor mixture containing a gaseous monomer, a gaseous polymerization initiator, and a solvent into a reaction chamber, forming free-radicals of the polymerization initiator, and contacting a substrate within the reaction chamber with the gaseous monomer, the free-radicals, and the solvent to form a polymeric thin film on the substrate. The monomer, the polymerization initiator, and the solvent may be introduced simultaneously into the reaction chamber or successively such that the precursor mixture is formed within the chamber. In certain embodiments, free-radicals of the polymerization initiator may be formed by heating the precursor mixture and/or through any other suitable technique.

The solvent, which may be incorporated into the polymer matrix during the polymerization process, may phase separate from the polymer matrix to form inclusions (e.g., liquid inclusions) within the polymer thin film. At least a portion of the solvent may be removed from the polymeric matrix to form a nanovoided polymeric thin film on the substrate, where the nanovoids occupy regions within the polymer matrix previously-filled with the solvent.

A further example method may include heating a precursor mixture containing a gaseous monomer, a gaseous polymerization initiator, and a solvent to form a polymeric thin film that includes the solvent and removing the solvent from the polymeric thin film to form a nanovoided polymeric thin film. In some embodiments, an extraction solvent may be used to remove the solvent. The extraction solvent may exhibit a lower surface tension with the polymer than the solvent and thus facilitate solvent removal without mechanically damaging the polymer matrix. In certain embodiments, the extraction solvent may form an azeotrope with the solvent. An example extraction solvent may include carbon dioxide, e.g., super-critical $CO_2$.

In accordance with some embodiments, the solvent may be removed during or after formation of the polymeric thin film. For example, the solvent may be removed periodically during formation of the nanovoided polymeric thin film. As used herein, removal of the solvent, such as by evaporation, may include the removal of a majority of the solvent from the polymer matrix, i.e., at least approximately 50% of a total volume of the solvent within the polymer matrix, e.g., at least approximately 50%, approximately 60%, approximately 70%, approximately 80%, approximately 90%, approximately 95%, approximately 97%, approximately 98%, approximately 99%, approximately 99.5%, approximately 99.9%, or approximately 100% of a total volume of the solvent within the polymer matrix, including ranges between any of the foregoing values.

In a further example method, a mixture including a gaseous polymerization initiator, a gaseous monomer, and a solvent may be introduced to a reaction chamber to form a polymeric thin film on a substrate such that the polymeric thin film includes the solvent. The substrate may be heated to remove the solvent from the polymeric thin film to form a nanovoided polymeric thin film.

The solvent may include one or more compounds, including a first solvent and a second solvent. In some embodiments, the solvent may include a first solvent and a second solvent, where the first and second solvents are mutually immiscible. The solvent may be incorporated into the precursor mixture (and hence into the reaction chamber) as a liquid or in the vapor phase and absorbed or incorporated into the mixture of the initiator and the monomer on the substrate.

During the deposition process, characteristics of the nanovoided polymeric thin film, such as the average void size and the void size distribution, may be controlled by varying at least one process condition, such as the ratio of the gaseous monomer to the solvent in the precursor mixture. For instance, according to some embodiments, a larger pore volume may be achieved by increasing the relative amount of solvent in the precursor mixture. In certain embodiments, a ratio of the gaseous monomer flow rate to the solvent flow rate may be increased, held constant, or decreased during the act of introducing the precursor mixture.

The nanovoided polymeric thin film may be formed on any suitable substrate, including a planar substrate, such as a conductive electrode, or a 3D substrate, such as a fibrous substrate. Example fibrous substrates may include glass fibers. A nanovoided polymeric thin film formed by i-CVD may be incorporated into a variety of different devices, including actuators, sensors, active or passive optics, or optical waveguides. In accordance with one example embodiment, a dielectric elastomer actuator may include a nanovoided polymeric thin film formed by i-CVD.

The following will provide, with reference to FIGS. 1-6, a detailed description of methods, systems and apparatuses for forming nanovoided polymeric materials, as well as electroactive devices and optical devices that use nanovoided polymeric materials. The discussion associated with FIGS. 1-4 includes a description of initiated chemical vapor deposition (i-CVD) methods for forming nanovoided polymeric materials according to some embodiments. The discussion associated with FIG. 5 includes a description of an example device including an i-CVD-derived nanovoided thin film polymer according to some embodiments. Detailed descriptions of methods for fabricating nanovoided polymeric thin films will be provided in connection with FIG. 6. As will be appreciated, the terms "polymer" and "polymeric" are used interchangeably herein to refer to large molecule or macromolecule compositions composed of many repeated subunits.

Figure 1:
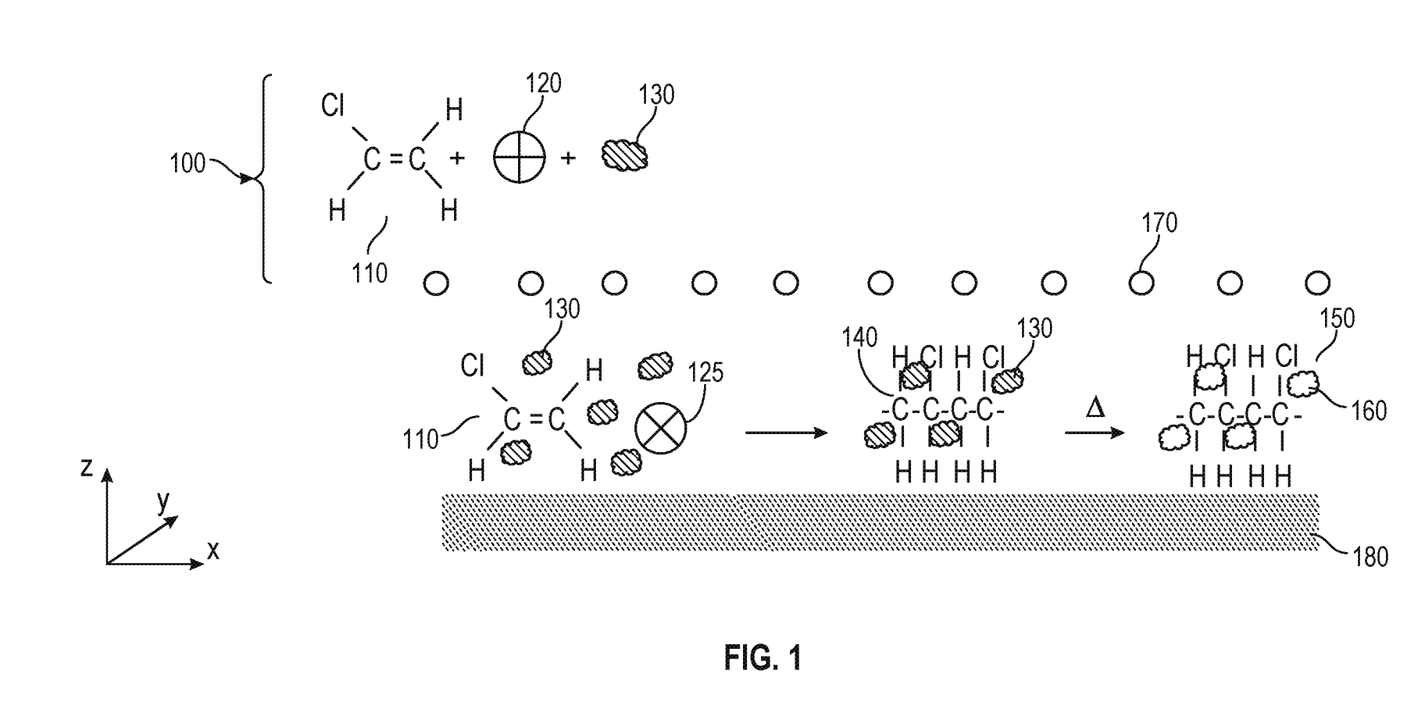
FIG. 1 shows a schematic diagram of an example initiated chemical vapor deposition method for fabricating nanovoided polymeric thin films according to various embodiments.

FIG. 1 shows an example method for fabricating a nanovoided polymeric thin film by initiated chemical vapor deposition. In the schematic diagram, a precursor mixture 100 including a gaseous monomer 110, a gaseous polymerization initiator 120, and a solvent 130 may be introduced into a reaction chamber fitted with an array of heated filaments 170 proximate to a temperature-controlled substrate 180. In some embodiments, the precursor mixture 100 may further include a carrier gas. The carrier gas may be an inert gas, such as nitrogen or argon. According to further embodiments, the carrier gas may include, for example, $SF_6$ and/or a fluorocarbon gas (e.g., NOVEC 4710 insulating gas, available from 3M Company, Maplewood, Minn., USA). The carrier gas may be incorporated into the nanovoids.

In accordance with certain embodiments, example monomers 110 may include poly(glycidyl methacrylate), p-bromophenyl methacrylate, pentabromophenyl methacrylate, n-vinyl carbazole, p-divinyl benzene, vinyl chloride, styrene, alpha methyl styrene, 2-chlorostyrene, 3-chlorostyrene, 4-chlorostyrene, 2,3-dichlorostyrene, 2,4-dichlorostyrene, 2,5-dichlorostyrene, 2,6-dichlorostyrene, 3,4-dichlorostyrene, 3,5-dichlorostyrene, 2-bromostyrene, 3-bromostyrene, 4-bromostyrene, 2,3-dibromostyrene, 2,4-dibromostyrene, 2,5-dibromostyrene, 2,6-dibromostyrene, 3,4-dibromostyrene, 3,5-dibromostyrene, methyl acrylate, n-butyl acrylate, n-pentyl acrylate, n-hexyl acrylate, n-heptyl acrylate, n-octyl acrylate, 2-ethylhexyl acrylate, perfluorocyclohexylmethyl acrylate, benzyl acrylate, 2-hydroxyethyl acrylate, dimethylaminoethyl acrylate, $Et_3DMAA$ (N,N-dimethylacetoacetamide), sec-butyl acrylate, tert-butyl acrylate, isobornyl acrylate, ethylene glycol diacrylate, methyl methacrylate, ethyl methacrylate, n-propyl methacrylate, n-butyl methacrylate, isobutyl methacrylate, n-pentyl methacrylate, n-hexyl methacrylate, n-heptyl methacrylate, sec-butyl methacrylate, tert-amyl methacrylate, t-butyl methacrylate, dimethylaminoethyl methacrylate, hydroxyethyl methacrylate, cyclohexyl methacrylate, benzyl methacrylate, isobornyl methacrylate, glycidyl methacrylate, ethylene glycol dimethacrylate, methacrylic acid, styrene, alpha-methyl styrene, ortho-methyl styrene, meta-methyl styrene, para-methyl styrene, para-ethyl styrene, 2,4-dimethyl styrene, 2,5-dimethyl styrene, m-divinylbenzene, p-divinylbenzene, vinylimidazole, N-vinyl-2-pyrrolidone, 1,4-divinyloxybutane, diethylene glygol divinyl ether, methyl trans-cinnamate, N-morpholinoethyl acrylate, 2-morpholinoethyl methacrylate, 2-isocyanatoethyl methacrylate, 2-sulfoethyl methacrylate, 2-methoxyethyl methacrylate, 2-(tert-butylamino)ethyl methacrylate, 2-ethoxyethyl methacrylate, 2-chloroethyl methacrylate, 2-hydroxypropyl methacrylate, 2-diethylaminoethyl methacrylate, cyclopentyl methacrylate, 2-(diisopropylamino)ethyl methacrylate, 2-bromoethyl methacrylate, or 2-phenylethyl methacrylate, as well as combinations thereof.

In some embodiments, the gaseous initiator 120, which is adapted to form free-radicals of a polymerization initiator, may include one or more of hydrogen peroxide, hydroperoxides, alkyl or aryl peroxides (e.g., tert-butyl peroxide), halogens, or non-oxidizing compounds, such as azo compounds (e.g., bis((1,1-dimethyl)diazene).

In accordance with various embodiments, example solvents 130 include water, xylene, anisole, decalin, cyclohexane, cyclohexene, methylcyclohexane, ethylcyclohexane, ethyl acetate, heptane, hexane, octane, nonane, decane, dodecane, dimethyl formamide, mixtures of C8-C11 alkanes, or mixtures of C8-C11 aromatic hydrocarbons, as well as combinations thereof. Further example solvents 130 include alcohols, such as methanol, ethanol, 1-propanol, 2-propanol, 1-butanol, or 2-butanol.

It will be appreciated that the monomer, initiator and/or solvent may include compounds that are liquid or solid at standard temperature and pressure (STP) but may be vaporized and introduced into the reaction chamber.

In embodiments where multiple solvents are used, two or more of the solvents may be mutually immiscible. According to some embodiments, mutually immiscible solvents may form an emulsion as they condense onto the substrate 180. For instance, dimethyl formamide and hexane may be used as immiscible co-solvents. Moreover, a monomer 110 may be substantially soluble in one of the mutually immiscible solvents and substantially in-soluble in the other, which may be used to generate desired voided architectures, such as cellular structures within the polymer matrix.

Components of the precursor mixture 100 (i.e., the monomer, polymerization initiator, solvent and/or carrier gas) may be evaporated or vaporized and metered into the reaction chamber using mass flow controllers or needle valves, for example. In certain embodiments, two or more monomers may be simultaneously delivered into the reaction chamber, which enables the formation of co-polymers, terpolymers, gradient chemistries, etc.

In some embodiments, the flow rate of the monomer 110, the polymerization initiator 120, and the solvent 130 may be independently chosen from approximately 0.5 sccm to approximately 100 sccm, e.g., approximately 0.5 sccm, approximately 1 sccm, approximately 2 sccm, approximately 5 sccm, approximately 10 sccm, approximately 20 sccm, approximately 50 sccm or approximately 100 sccm, including ranges between any of the foregoing values, although lesser and greater flow rates may be used. In embodiments where more than one monomer is used, the flow rate of any additional monomer may be independently selected from the foregoing values.

Referring still to FIG. 1, heated filaments 170 may initiate decomposition (e.g., pyrolysis) of the polymerization initiator 120 to form free-radicals 125 that promote polymerization of the monomers 110 as the monomers and free-radicals adsorb onto the surface of the substrate 180. In some embodiments, the heated filaments initiate formation of free-radicals from the polymerization initiator without cracking of the monomer. In some embodiments, the filament 170 to substrate 180 distance may be approximately 1 cm to approximately 5 cm. Polymerization of the adsorbed monomers may proceed on a cooled substrate 180. Additionally or alternatively, free-radicals may be formed of the polymerization initiator via any other suitable technique, including, for example, exposure to sufficiently high levels of actinic energy (e.g., electrons, electron beams, x-rays, gamma rays, ultraviolet and/or visible light, high energy levels, ions, etc.).

In certain embodiments, the solvent may co-deposit onto the substrate 180 with the initiated monomer. The solvent may, in turn, phase separate from the polymeric matrix to form liquid inclusions within the polymer thin film. Thus, the solvent 130 may be incorporated into the matrix of the nascent polymer thin film forming a solvated polymer 140, where inclusions of the solvent 130 inhibit complete densification of the polymeric matrix. The solvent 130 may then be evaporated by heating the polymeric thin film 140 to form a thin film of a nanovoided polymer 150 on the substrate 180, where the nanovoids 160 are formed within and defined by regions of the polymer matrix previously occupied by the solvent.

In an example process, the substrate 180 may be stationary within the reaction chamber. In some embodiments, the substrate 180 may be configured to incline, rotate, and/or translate, such as in a roll-to-roll process, which may improve the uniformity of the deposited thin film.

The temperature of the substrate 180 may be controlled during formation of the nanovoided polymeric thin film. By way of example, in certain embodiments, the substrate 180 may be maintained at a deposition temperature ($T_D$) during monomer and free-radical adsorption and the attendant polymerization, and maintained at an evaporation temperature ($T_E$) during removal of the solvent from the polymeric matrix. In various embodiments, the evaporation temperature ($T_E$) may be greater than the deposition temperature ($T_D$). The temperature of the substrate 180 may be controlled by a water bath or an oil bath, for example, or by using heating/cooling elements, such as thermoelectric elements (not shown).

According to some embodiments, the deposition temperature ($T_D$) may range from approximately 0° C. to approximately 100° C., e.g., approximately 0° C., approximately 10° C., approximately 25° C., approximately 50° C., approximately 75° C., or approximately 100° C., including ranges between any of the foregoing values, although lesser and greater deposition temperatures are contemplated. According to some embodiments, the evaporation temperature ($T_E$) may range from approximately 50° C. to approximately 200° C., e.g., approximately 50° C., approximately 100° C., approximately 150° C., or approximately 200° C., including ranges between any of the foregoing values, although lesser and greater evaporation temperatures may be used. In certain embodiments, the evaporation temperature may be greater than the boiling point of the solvent 130.

In some embodiments, the filament (or decomposition) temperature ($T_F$) may range from approximately 100° C. to approximately 400° C., e.g., approximately 100° C., approximately 150° C., approximately 200° C., approximately 250° C., approximately 300° C., approximately 350° C., or approximately 400° C., including ranges between any of the foregoing values, although lesser and greater filament temperatures may be used.

During deposition and/or solvent evaporation, the internal pressure of the reaction chamber may range from approximately 0.1 Torr to approximately 760 Torr, e.g., approximately 0.1 Torr, approximately 0.2 Torr, approximately 0.5 Torr, approximately 1 Torr, approximately 2 Torr, approximately 5 Torr, approximately 10 Torr, approximately 20 Torr, approximately 50 Torr, approximately 100 Torr, approximately 200 Torr, approximately 500 Torr, or approximately 760 Torr, including ranges between any of the foregoing values. In certain embodiments, a method of forming a nanovoided polymeric thin film may include depositing free-radicals, one or more monomer species, and a solvent on a substrate to form a polymeric thin film on the substrate at a deposition temperature ($T_D$) and a deposition pressure ($P_D$), and removing the solvent from the polymeric thin film at an evaporation temperature ($T_E$) and an evaporation pressure (PE).

In some embodiments, the deposition temperature ($T_D$) may be less than the evaporation temperature ($T_E$). In some embodiments, the deposition pressure ($P_D$) may be less than, equal to, or greater than the evaporation pressure ($P_E$). By way of example, the formation of a nanovoided polymeric thin film may include a deposition and polymerization step at a deposition temperature ($T_D$) followed by an evaporation step at an evaporation temperature ($T_E$).

According to a further example, the formation of a nanovoided polymeric thin film may include the repetition of alternating deposition/polymerization and evaporation steps at respective deposition and evaporation temperatures and pressures.

In accordance with certain embodiments, a deposition rate for the polymeric thin film may be approximately 1 nanometer/minute to 1 micrometer/minute, e.g., approximately 1 nm/min, approximately 2 nm/min, approximately 5 nm/min, approximately 10 nm/min, approximately 20 nm/min, approximately 50 nm/min, approximately 100 nm/min, approximately 200 nm/min, approximately 500 nm/min, or approximately 1000 nm/min, including ranges between any of the foregoing values.

Properties of a nanovoided polymeric thin film may be controlled by controlling these and other processing conditions. For instance, with the disclosed i-CVD process, the void size (d) and the void size distribution within a polymeric thin film can be locally controlled, e.g., as a function of film thickness, by selecting appropriate precursor gases and solvents, as well as their relative compositions within the precursor mixture during deposition. Without wishing to be bound by theory, the total void volume and/or the average void size within the polymeric thin film may be proportional to the relative solvent content in the precursor mixture. As will be disclosed in further detail herein, control of the void geometry may enable control of various physical and optical properties of the polymeric thin film, including its Poisson's ratio and/or its refractive index.

In certain embodiments, and by way of example, a ratio of the monomer flow rate to the initiator flow rate (i.e., monomer flow rate/initiator flow rate) into the reaction chamber may range from approximately 0.1 to approximately 10, e.g., approximately 0.1, approximately 0.2, approximately 0.5, approximately 1, approximately 2, approximately 5, or approximately 10, including ranges between any of the foregoing values. In certain embodiments, a ratio of the monomer flow rate to the solvent flow rate (i.e., monomer flow rate/solvent flow rate) into the reaction chamber may range from approximately 0.1 to approximately 10, e.g., approximately 0.1, approximately 0.2, approximately 0.5, approximately 1, approximately 2, approximately 5, or approximately 10, including ranges between any of the foregoing values.

In some embodiments, the ratio of the gaseous monomer flow rate to the polymerization initiator flow rate and/or the ratio of the gaseous monomer flow rate to the solvent flow rate may be independently increased, held constant, or decreased during the act of forming a nanovoided polymeric thin film. For instance, with reference to FIG. 2, by decreasing the ratio of the gaseous monomer flow rate to the solvent flow rate, larger voids may be formed.

Figure 2:
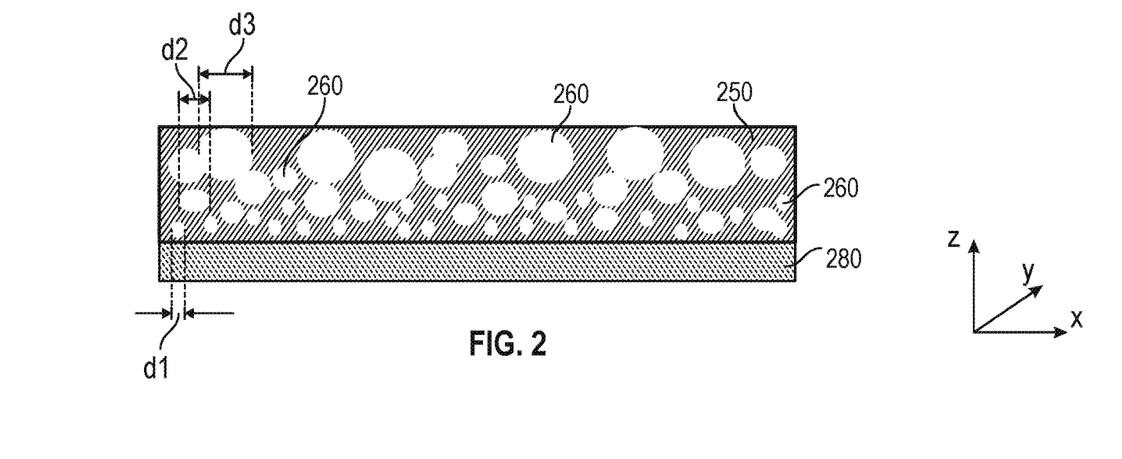
FIG. 2 shows a cross-sectional view of an example nanovoided polymeric thin film where the size of the nanovoids varies with thickness of the polymeric thin film according to certain embodiments.

In the embodiment illustrated in FIG. 2, the size (d) of the nanovoids 260 increases with the thickness of the nanovoided polymer thin film 250, i.e., in the z-direction, such that d1<d2<d3, where d1 is the size (e.g., diameter) of voids 260 proximate to the substrate 280, d2 is the void size within an intermediate region of the nanovoided polymer thin film 250, and d3 is the void size proximate to an upper surface (e.g., free surface) of the nanovoided polymer thin film 250. The void geometry shown schematically in FIG. 2 may be achieved by increasing the relative amount of solvent in the precursor mixture during formation of the nanovoided polymer thin film 250. Due to the spatially changing void geometry of FIG. 2, the nanovoided polymer thin film 250 may exhibit a graded refractive index, where the refractive index decreases with increasing distance from the substrate 280. In alternate embodiments, the nanovoided polymer thin film 250 may exhibit a graded refractive index, where the refractive index increases with increasing distance from the substrate 280.

In some embodiments, the refractive index of i-CVD nanovoided polymer thin films may be less than the refractive index of comparative, un-voided polymers. In certain embodiments, the refractive index of at least a portion of a nanovoided polymer thin film formed by i-CVD may be approximately 1.05 to approximately 1.35, e.g., approximately 1.05, approximately 1.10, approximately 1.15, approximately 1.20, approximately 1.25, approximately 1.30, or approximately 1.35, including ranges between any of the foregoing values.

The incorporation of nanovoids 260 into the nanovoided polymer material is not restricted to changing the properties of the entirety of the nanovoided polymer thin film. Nanovoids may be used selectively throughout the nanovoided polymer material to induce different behavior locally within the nanovoided polymer thin film.

Figure 3A:
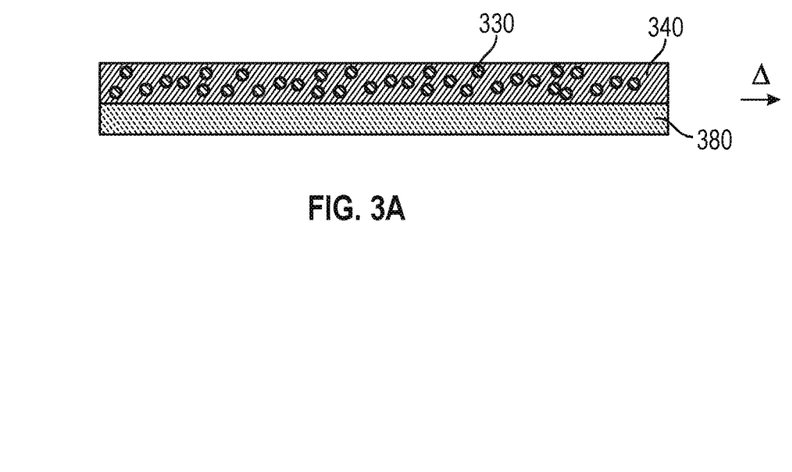
FIG. 3A shows a schematic diagram of an example polymer thin film having inclusions of a solvent dispersed throughout the polymer matrix according to some embodiments.
Figure 3B:
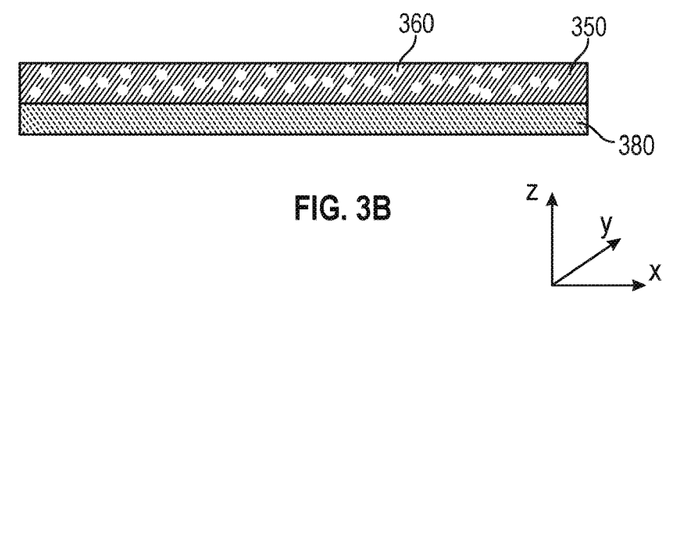
FIG. 3B shows a schematic diagram of the polymer thin film of FIG. 3A following removal of the solvent and the attendant formation of nanovoids within the polymer matrix according to some embodiments.

As previously disclosed, removal of the solvent from within the polymer matrix may be conducted following formation of a polymeric thin film or periodically throughout thin film formation. For instance, with reference to FIG. 3A, prior to removal of the solvent, inclusions of a solvent 330 are dispersed throughout a solvated polymer thin film 340 formed on a substrate 380. As shown in FIG. 3B, heating of the solvated polymer thin film 340, e.g., by increasing the temperature of the substrate, may cause evaporation of at least a portion of the solvent 330 and form a plurality of nanovoids 360 defined throughout the polymer matrix.

Figure 4A:
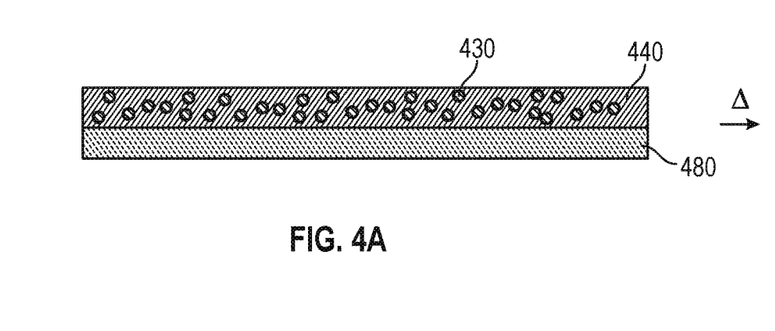
FIG. 4A shows a schematic diagram of an example polymer thin film having inclusions of a solvent dispersed throughout the polymer matrix according to further embodiments.
Figure 4B:
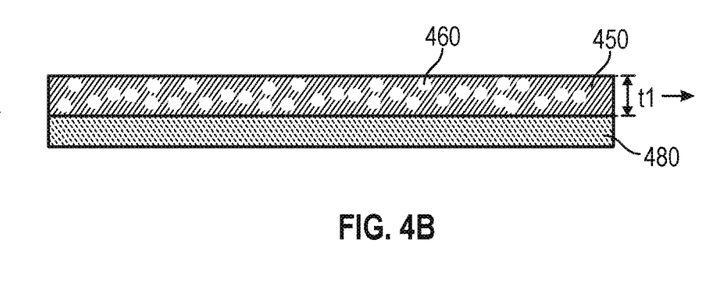
FIG. 4B shows a schematic diagram of the polymer thin film of FIG. 4A following removal of the solvent and the attendant formation of nanovoids within the polymer matrix according to some embodiments.
Figure 4C:
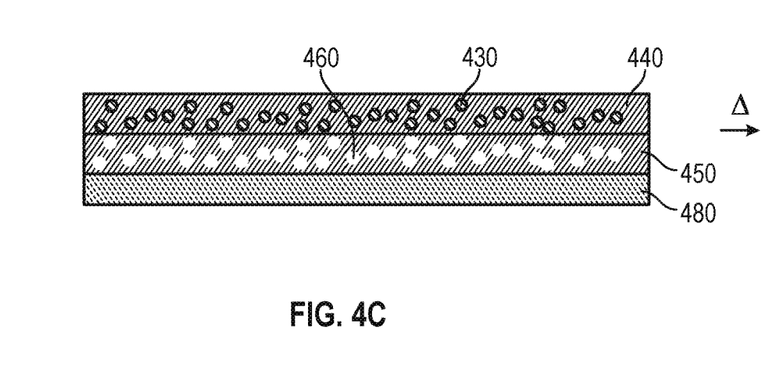
FIG. 4C shows a schematic diagram of an example thin film architecture following the formation of a solvated polymer thin film over the nanovoided polymeric thin film of FIG. 4B according to some embodiments.
Figure 4D:
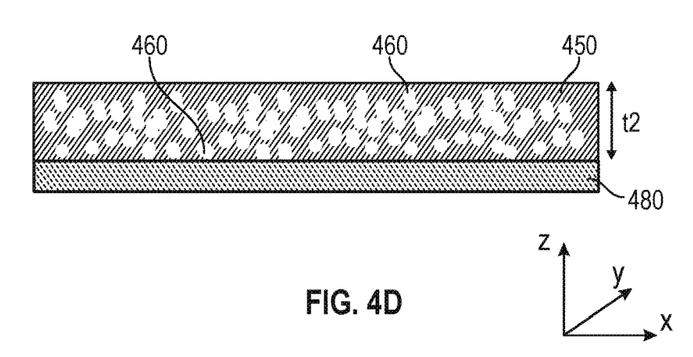
FIG. 4D shows a schematic diagram of the polymer thin film of FIG. 4C following removal of the solvent and the formation of nanovoids within the polymer matrix according to further embodiments.

According to some embodiments, solvent removal may be conducted periodically throughout the act of forming a nanovoided polymeric thin film. Referring to FIG. 4A, for example, a solvated polymer thin film 440 including inclusions of a solvent 430 dispersed throughout the polymer matrix may be formed on a substrate 480 using an i-CVD method as disclosed herein. As shown in FIG. 4B, the temperature of the substrate 480 may be increased above the evaporation temperature ($T_E$) of the solvent 430, resulting in the removal of the solvent and the formation of nanovoids 460 within nanovoided polymer thin film 450. The nanovoided polymer thin film 450 in FIG. 4B has a thickness (t1). As shown in FIG. 4C, a further solvated polymer thin film 440 including disposed inclusions of a solvent 430 may be formed on the nanovoided polymer thin film 450 at a deposition temperature ($T_D$). As shown in FIG. 4D, the temperature of the substrate 480 may be again increased above the evaporation temperature ($T_E$) of the solvent 430, resulting in the removal of the solvent from the solvated polymer thin film 440. The resulting nanovoided polymer thin film 450 has a thickness (t2) where t2>t1.

In some embodiments, the nanovoids may occupy at least approximately 10% of the volume of a nanovoided polymeric thin film (e.g., approximately 10% by volume, approximately 20% by volume, approximately 30% by volume, approximately 40% by volume, approximately 50% by volume, approximately 60% by volume, approximately 70% by volume, approximately 80% by volume, or approximately 90% by volume, including ranges between any of the foregoing values).

The voids may be either closed- or open-celled, or a combination thereof. For open-celled voids, the void size (d) may be the minimum average diameter of the cell. The voids may be any suitable size and, in some embodiments, the voids may approach the scale of the thickness of the polymeric layer.

In some embodiments, the void size may be between approximately 10 nm and approximately 1000 nm, such as between approximately 10 and approximately 200 nm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 110 nm, approximately 120 nm, approximately 130 nm, approximately 140 nm, approximately 150 nm, approximately 160 nm, approximately 170 nm, approximately 180 nm, approximately 190 nm, approximately 200 nm, approximately 250 nm, approximately 300 nm, approximately 400 nm, approximately 500 nm, approximately 600 nm, approximately 700 nm, approximately 800 nm, approximately 900 nm, or approximately 1000 nm, including ranges between any of the foregoing values).

The incorporation of nanovoids into the polymeric matrix may impact the deformation response of the nanovoided polymeric thin film to an applied load. An effective modulus ($Y_{eff}$) for a nanovoided polymer material where the modulus of the material within the voids (e.g., air) is much less than the modulus of the polymer matrix ($Y_{void} \ll Y_{dielectric}$) can be expressed as $Y_{eff} = Y_{dielectric}(1-\Phi_{void})$, where $\Phi_{void}$ is the volume fraction of voids. In some embodiments, the nanovoided polymer material may include a thermoset material and/or any other suitable material having an elastic modulus of less than approximately 10 GPa (e.g., approximately 0.5 GPa, approximately 1 GPa, approximately 2 GPa, approximately 3 GPa, approximately 4 GPa, approximately 5 GPa, approximately 6 GPa, approximately 7 GPa, approximately 8 GPa, or approximately 9 GPa, including ranges between any of the foregoing values).

According to some embodiments, nanovoids may be distributed homogeneously or non-homogeneously throughout the nanovoided polymer material. By way of example, the void size and/or the void size distribution may vary spatially within the nanovoided polymer material, i.e., laterally and/or with respect to the thickness of the nanovoided polymer material. Adjusting the void fraction of an EAP, for instance, can be used to tune its compressive stress-strain characteristics.

According to some embodiments, the voids may be substantially spherical, although the void shape is not particularly limited. For instance, in addition to, or in lieu of spherical voids, the nanovoided polymer material may include voids that are oblate, prolate, lenticular, ovoid, etc., and may be characterized by a convex and/or a concave cross-sectional shape. Moreover, the topology of the voids throughout the polymer matrix may be uniform or non-uniform. As used herein "topology" with reference to the nanovoids refers to their overall arrangement within the nanovoided polymer and may include their size and shape as well as their respective distribution (density, periodicity, etc.) throughout the polymer matrix.

In accordance with certain embodiments, a nanovoided polymeric thin film may include an electroactive polymer. As used herein, "electroactive polymers" may refer to polymers that exhibit a change in size or shape when stimulated by an electric field. In this regard, some electroactive polymers may have limited applications due to a low breakdown voltage of the polymers with respect to the operating voltage used by electroactive devices (e.g., actuators) that use the polymers. Accordingly, electroactive devices with reduced operating voltages and higher energy densities may be useful for many applications. Furthermore, many electroactive polymers, including bulk electroactive polymers, may exhibit only a lateral expansion in response to compression, which may also limit their applicability to particular device architectures. In contrast, the realization of a contraction in at least one lateral dimension in response to compression may be advantageous for certain applications.

In some examples, an electroactive polymer may include a deformable polymer that may be symmetric with regard to electrical charge (e.g., polydimethylsiloxane (PDMS) acrylates, etc.) or asymmetric (e.g., poled polyvinylidene fluoride (PVDF) or its co-polymers such as poly(vinylidene-fluoride-co-trifluoroethylene) (PVDF-TrFE)). Additional examples of polymeric materials forming electroactive polymers may include, without limitation, styrenes, polyesters, polycarbonates, epoxies (e.g., B-stage epoxies), halogenated polymers, such as PVDF, co-polymers of PVDF, such as PVDF-TrFE, silicone polymers, and/or any other suitable polymer materials. Such materials may have any suitable dielectric constant or relative permittivity, such as, for example, a dielectric constant ranging from approximately 1.2 to approximately 30.

In the presence of an electrostatic field, an electroactive polymer may deform (e.g., compress, elongate, bend, etc.) according to the magnitude and direction of that field. Generation of such a field may be accomplished, for example, by placing the electroactive polymer between two electrodes, each of which is at a different potential. As the potential difference (i.e., voltage difference) between the electrodes is increased or decreased (e.g., from zero potential) the amount of deformation may also increase, principally along electric field lines. This deformation may achieve saturation when a certain electrostatic field strength has been reached. With no electrostatic field, the electroactive polymer may be in its relaxed state undergoing no induced deformation, or stated equivalently, no induced strain, either internal or external.

The physical origin of the compressive nature of electroactive polymers in the presence of an electrostatic field (E-field), being the force created between opposite electric charges, is that of the Maxwell stress, which is expressed mathematically with the Maxwell stress tensor. The level of strain or deformation induced by a given E-field is dependent on the square of the E-field strength, the dielectric constant of the electroactive polymer, and on the elastic compliance of the material in question. Compliance in this case is the change of strain with respect to stress or, equivalently, in more practical terms, the change in displacement with respect to force.

Figure 5:
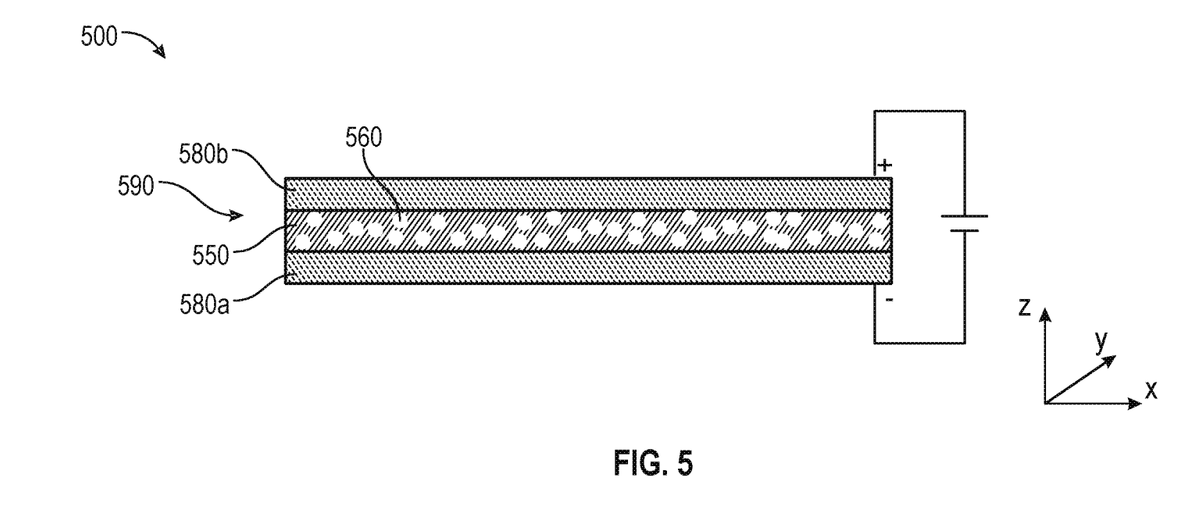
FIG. 5 shows a cross-sectional view of an example electroactive device including a nanovoided polymeric thin film formed by i-CVD in accordance with one or more embodiments of the disclosure.

Nanovoided polymeric thin films formed by i-CVD can be incorporated into a variety of different devices. An example device, as shown schematically in FIG. 5, is a nanovoided actuator 500 where an electroactive element 590 includes a nanovoided polymeric thin film having a polymer matrix 550 and a plurality of nanovoids 560 dispersed throughout the polymer matrix 550.

The electroactive element 590 is disposed between a primary electrode 580*a* and a secondary electrode 580*b*. The application of a voltage between the electrodes 580*a*, 580*b* can cause compression of the electroactive nanovoided polymeric thin film in the direction of the applied electric field and an associated expansion or contraction of the electroactive nanovoided polymeric thin film in one or more transverse dimensions.

In some embodiments, the electrodes (e.g., the primary electrode 580*a* and the secondary electrode 580*b*) may include metals such as aluminum, gold, silver, tin, copper, indium, gallium, zinc, and the like. Other conductive materials may be used, including carbon nanotubes, graphene, transparent conductive oxides (TCOs, e.g., indium tin oxide (ITO), zinc oxide (ZnO), etc.), and the like.

In some configurations, the electrodes may be configured to stretch elastically. In such embodiments, the electrodes may include TCOs, graphene, carbon nanotubes, and the like. In other embodiments, for example, embodiments where electroactive devices have electroactive polymer elements including nanovoided electroactive polymer materials, relatively rigid electrodes (e.g. electrodes including a metal such as aluminum) may be used.

In some embodiments, the electrodes (e.g., the primary electrode 580*a* and the secondary electrode 580*b*) may have a thickness of approximately 1 nm to approximately 1000 nm, with an example thickness of approximately 10 nm to approximately 50 nm. Some of the electrodes (e.g., the primary electrode 580*a* or the secondary electrode 580*b*) may be designed to allow healing of electrical breakdown (e.g., the electric breakdown of elastomeric polymer materials). In some embodiments, a thickness of an electrode that includes a self-healing electrode (e.g., an aluminum electrode) may be approximately 20 nm.

In some embodiments, the electrodes (e.g., the primary electrode 580*a* and the secondary electrode 580*b*) may be fabricated using any suitable process. For example, the electrodes may be fabricated using physical vapor deposition (PVD), chemical vapor deposition (CVD), evaporation, spray-coating, spin-coating, atomic layer deposition (ALD), and the like. In another aspect, the electrodes may be manufactured using a thermal evaporator, a sputtering system, a spray coater, a spin-coater, an ALD unit, and the like.

The methods and systems shown and described herein may be used to form electroactive devices having a single layer or multiple layers of a nanovoided electroactive polymer (e.g., a few layers to tens, hundreds, or thousands of stacked layers). For example, an electroactive device may include a stack of from two electroactive polymer elements and corresponding electrodes to thousands of electroactive polymer elements (e.g., from 2 electroactive polymer elements to approximately 5, approximately 10, approximately 20, approximately 30, approximately 40, approximately 50, approximately 100, approximately 200, approximately 300, approximately 400, approximately 500, approximately 600, approximately 700, approximately 800, approximately 900, approximately 1000, approximately 2000, or greater than approximately 2000 electroactive polymer elements, including ranges between any of the foregoing values). A large number of layers may be used to achieve a high displacement output, where the overall device displacement may be expressed as the sum of the displacement of each layer.

In some embodiments, the nanovoided polymeric thin film may include an elastomer material. As used herein, an "elastomer material" may refer to a polymer with viscoelasticity (i.e., both viscosity and elasticity) and relatively weak intermolecular forces, and generally low elastic modulus (a measure of the stiffness of a solid material) and high failure strain compared with other materials. In some embodiments, the electroactive polymer element (e.g., nanovoided polymeric thin film) may include an elastomer material that has an effective Poisson's ratio of less than approximately 0.35 and may include an auxetic material that has a negative Poisson's ratio. For instance, the elastomer material may have a Poisson's ratio of less than approximately 0.35 (e.g., 0.35, 0.3, 0.25, 0.2, 0.15, 0.1, 0.05, −0.05, −0.1, −0.15, −0.2, −0.25, −0.3, −0.35, or less, including ranges between any of the foregoing values). In some embodiments, the elastomer material may exhibit a compressive strain of at least approximately 10% when a voltage is applied between the primary electrode 580a and the secondary electrode 580b.

In some embodiments, the electroactive polymer element 590 may have a thickness of approximately 10 nm to approximately 10 μm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 200 nm, approximately 300 nm, approximately 400 nm, approximately 500 nm, approximately 600 nm, approximately 700 nm, approximately 800 nm, approximately 900 nm, approximately 1 μm, approximately 2 μm, approximately 3 μm, approximately 4 μm, approximately 5 μm, approximately 6 μm, approximately 7 μm, approximately 8 μm, approximately 9 μm, or approximately 10 μm, including ranges between any of the foregoing values), with an example thickness of approximately 200 nm to approximately 500 nm.

As disclosed herein, nanovoided polymeric thin films may be formed using a solvent-based initiated chemical vapor deposition process, where solvent is temporarily incorporated into the structure of a deposited polymeric thin film. Nanovoids may be created within the polymeric thin film via removal of the solvent, where the nanovoids are formed within regions previously occupied by the solvent. A variety of nanovoided polymer compositions may be formed using the presently-disclosed method, including acrylates, styrenes, PTFE, vinylpyrrolidone and maleic anhydride. Electroactive and optical devices may be manufactured using nanovoided polymeric thin films formed by i-CVD. Processing conditions, including the amount of solvent incorporated into the precursor mixture, can be used to control the formation of nanovoids within the polymer matrix of a nanovoided polymeric thin film.

Figure 6:
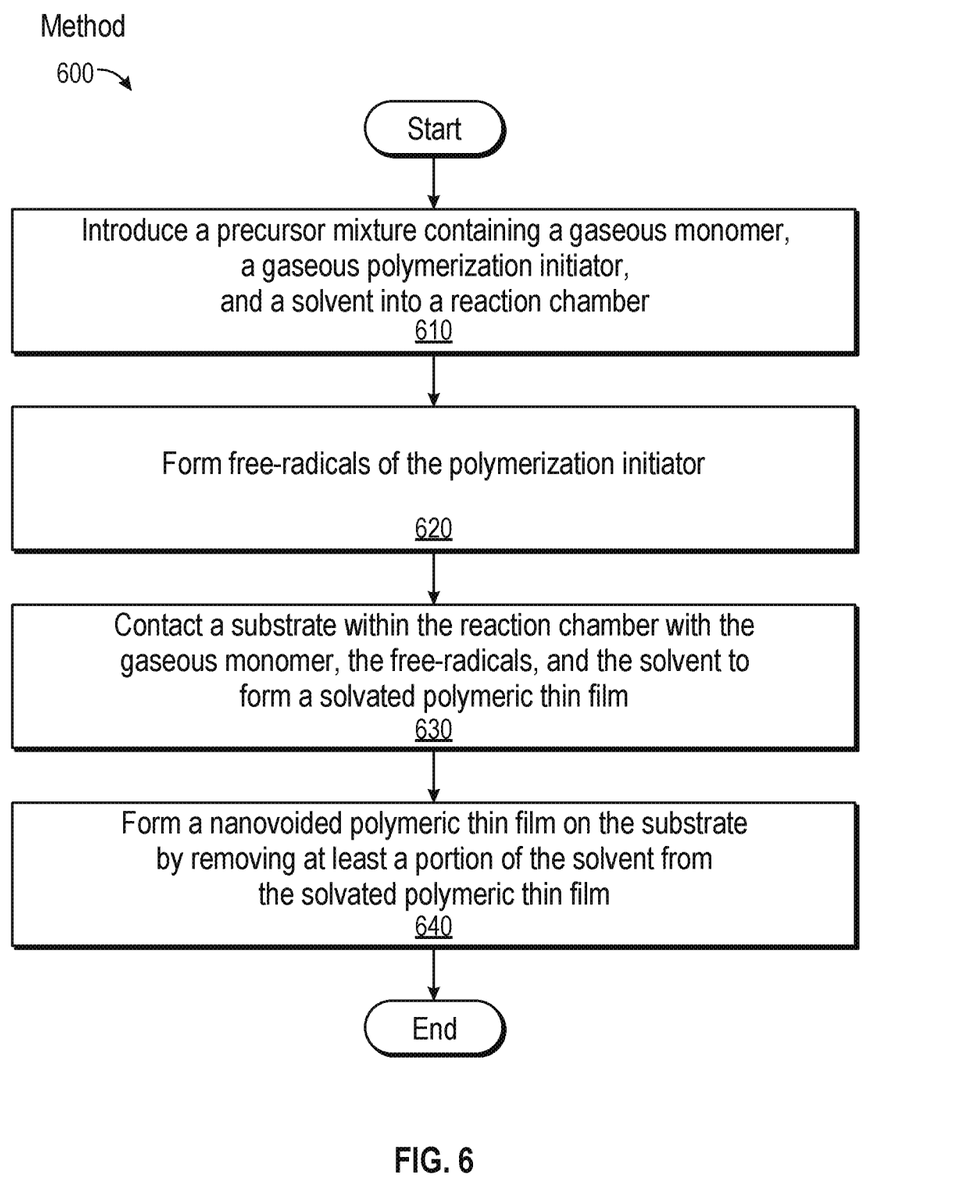
FIG. 6 is a flow diagram of an example method for fabricating nanovoided polymeric thin films according to some embodiments.

FIG. 6 shows a flow diagram of an example method 600 for producing a nanovoided polymeric thin film in accordance with example embodiments of the disclosure. At step 610, a mixture (e.g., precursor mixture 100 in FIG. 1) may be introduced into a reaction chamber. The mixture includes a gaseous polymerization initiator, a gaseous monomer, and a solvent. At step 620 in FIG. 6, free-radicals are formed of the polymerization initiator (e.g., free-radicals 125 in FIG. 1). For example, the precursor mixture may be heated to form free-radicals of the polymerization initiator.

At step 630 in FIG. 6, a substrate within the reaction chamber is contacted with the free-radicals, the gaseous monomer, and the solvent to form a polymeric thin film (e.g., solvated polymer 140) on the substrate. Referring to step 640 in FIG. 6, at least a portion of the solvent is removed from the polymeric thin film to form a nanovoided polymeric thin film on the substrate.

According to some embodiments, a temporally-mediated cure during the act of solvent removal may be used to control the topology of the voids. Geometrically anisotropic voids, for instance, including oblate spheroids, may be engineered by introducing a partial cure of monomeric, oligomeric and/or polymeric species prior to completely removing the solvent from the polymeric thin film. By partially curing the thin film in a first curing step, i.e., during removal of the solvent, collapse of the polymer matrix under the effects of evaporation-induced surface tension may be avoided. A second curing step following solvent removal may be used to form the nanovoided polymeric thin film. In some embodiments, the first and second curing steps may be performed using any suitable process, including a thermal process, a radiative (e.g., UV) process, an electron beam process, or by using chemical additives as curing agents. By way of example, a 2-step cure may include a partial thermal cure during solvent removal and an e-beam cure following solvent removal.

In some embodiments, the gaseous monomer may include a single component that may be partially cured in the first curing step and then fully cured in the second curing step. In some embodiments, the gaseous monomer may include two or more components that may be independently cured such that, for example, a first component may be cured during the first curing step and a second component may be cured during the second curing step.

Embodiments of the present disclosure may include or be implemented in conjunction with an artificial reality system. Artificial reality is a form of perceived reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in artificial reality and/or are otherwise used (e.g., perform activities) in artificial reality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A method comprising:
   introducing a mixture comprising a gaseous polymerization initiator, a gaseous monomer, and a solvent into a reaction chamber;
   forming free-radicals of the gaseous polymerization initiator;
   contacting a substrate within the reaction chamber with the free-radicals, the gaseous monomer, and the solvent to form a polymeric thin film on the substrate,
   wherein the solvent forms liquid inclusions within the polymeric thin film; and
   removing at least a portion of the solvent from the polymeric thin film to form a nanovoided polymeric thin film on the substrate.

2. The method of claim 1, wherein the mixture further comprises a carrier gas.

3. The method of claim 1, wherein a ratio of a flow rate of the gaseous monomer to a flow rate of the solvent is constant during the act of introducing the mixture.

4. The method of claim 1, wherein a ratio of a flow rate of the gaseous monomer to a flow rate of the solvent increases or decreases during the act of introducing the mixture,
   wherein a variation in the ratio of the flow rate of the gaseous monomer to the flow rate of the solvent results in a variation of nanovoid size within the polymeric thin film.

5. The method of claim 1, wherein a ratio of a flow rate of the gaseous monomer to a flow rate of the solvent is between approximately 0.1 and approximately 10 during the act of introducing the mixture.

6. The method of claim 1, wherein the solvent is removed periodically during formation of the nanovoided polymeric thin film.

7. The method of claim 1, further comprising curing a first portion of the polymeric thin film prior to removing at least a portion of the solvent and curing a second portion of the polymeric thin film after removing at least a portion of the solvent.

8. The method of claim 1, wherein the solvent comprises a first solvent and a second solvent, and the first solvent is immiscible with the second solvent.

9. The method of claim 1, wherein a refractive index of the nanovoided polymeric thin film is approximately 1.05 to approximately 1.35.

10. The method of claim 1, wherein forming the free-radicals comprises heating the mixture to form the free-radicals of the gaseous polymerization initiator.

11. A method comprising:
    heating a mixture comprising a gaseous polymerization initiator, a gaseous monomer, and a solvent to form a polymeric thin film comprising the solvent,
    wherein the solvent forms liquid inclusions within the polymeric thin film; and
    removing the solvent from the polymeric thin film to form a nanovoided polymeric thin film.

12. The method of claim 11, wherein the nanovoided polymeric thin film is substantially planar.

13. The method of claim 11, wherein removing the solvent comprises:
    forming an azeotrope within the polymeric thin film, wherein the azeotrope comprises the solvent and an extraction solvent; and
    removing the azeotrope from the polymeric thin film.

14. The method of claim 11, wherein the solvent comprises a first solvent and a second solvent, and the first solvent is immiscible with the second solvent.

15. The method of claim 11, wherein removing the solvent from the polymeric thin film comprises heating the polymeric thin film to a temperature greater than a boiling point of the solvent.

16. A method comprising:
    heating a mixture comprising a gaseous polymerization initiator, a gaseous monomer, and a solvent within a reaction chamber to form a polymeric thin film on a substrate, wherein the polymeric thin film comprises the solvent and the solvent forms liquid inclusions within the polymeric thin film; and
    heating the substrate to remove the solvent from the polymeric thin film to form a nanovoided polymeric thin film.

17. The method of claim 16, wherein the gaseous monomer and the solvent are introduced into the reaction chamber and a ratio of a flow rate of the gaseous monomer to a flow rate of the solvent increases during a primary stage of forming the polymeric thin film and decreases during a secondary stage of forming the polymeric thin film following the primary stage,
    wherein a variation in the ratio of the flow rate of the gaseous monomer to the flow rate of the solvent results in a variation in nanovoid size within the polymeric thin film.

18. The method of claim 16, wherein the gaseous monomer and the solvent are introduced into the reaction chamber and a ratio of a flow rate of the gaseous monomer to a flow rate of the solvent is between approximately 0.1 and approximately 10.

19. The method of claim 16, wherein a refractive index of the nanovoided polymeric thin film is approximately 1.05 to approximately 1.35.

20. The method of claim 16, wherein the substrate comprises an electrode.

* * * * *